United States Patent [19]

Hidai et al.

[11] 4,280,186
[45] Jul. 21, 1981

[54] EXPOSURE APPARATUS USING ELECTRON BEAMS

[75] Inventors: Yutaka Hidai, Kodaira; Nobuo Okuda, Yokohama, both of Japan

[73] Assignee: Tokyo Shibaura Denki Kabushiki Kaisha, Kawasaki, Japan

[21] Appl. No.: 53,215

[22] Filed: Jun. 29, 1979

[30] Foreign Application Priority Data

Jul. 7, 1978 [JP] Japan ................................. 53-82095
Jul. 7, 1978 [JP] Japan ................................. 53-82096
Nov. 27, 1978 [JP] Japan ............................... 53-145312

[51] Int. Cl.³ .............................................. G06F 3/14
[52] U.S. Cl. ............................. 364/518; 250/492 A; 340/747
[58] Field of Search .................. 364/518, 521, 522; 250/492 A; 340/703, 747; 178/15

[56] References Cited

U.S. PATENT DOCUMENTS

| | | | |
|---|---|---|---|
| 3,900,737 | 8/1975 | Collier et al. | 250/492 A |
| 3,906,480 | 9/1975 | Schwartz et al. | 340/747 |
| 3,925,776 | 12/1975 | Swallow | 340/703 |
| 3,946,365 | 3/1976 | Bantner | 340/747 |
| 4,125,873 | 11/1978 | Chesarek | 340/747 |
| 4,145,615 | 3/1979 | Sumi | 250/492 A |
| 4,147,937 | 4/1979 | Buelow et al. | 250/492 A |

FOREIGN PATENT DOCUMENTS 52-14055 4/1977 Japan ................................. 250/492 A
1405884 9/1975 United Kingdom ..................... 340/747

OTHER PUBLICATIONS

"Automatic Pattern Positioning of Scanning Electron Beam Exposure" by Miyauchi et al., IEEE Trans on Electron Devices, vol. ED-17, No. 6, Jun. 1970, pp. 450-457.

Primary Examiner—Charles E. Atkinson
Assistant Examiner—Gary Chin
Attorney, Agent, or Firm—Oblon, Fisher, Spivak, McClelland & Maier

[57] ABSTRACT

An exposure apparatus using an electron beam includes a first memory for storing pattern data representing various basic patterns, a data processor for reading from the first memory the pattern data necessary to form a pattern to be drawn, a second memory for storing data which correspond to the pattern data readout from the first memory by the data processor, and an electron beam generator for generating an electron beam according to the data stored in the second memory to achieve a raster scanning on a test piece. The first memory stores pattern parameters representing said various basic patterns. The exposure apparatus further includes a dot pattern data generator which writes into the second memory dot pattern data which correspond to the pattern parameters readout from the first memory by the data processor.

10 Claims, 16 Drawing Figures

| 0----34------------15 | |
|---|---|
| LOCA | PX1 |
| ✱ | PY |
| TRPZ | ΔL |
| ✱ | ΔH |
| ✱ | ΔX1 |
| ✱ | ΔX2 |

| 0----34------------15 | |
|---|---|
| LOCA | PX1 |
| ✱ | PY |
| SQAR | ΔL |

FIG. 10

EXPOSURE APPARATUS USING ELECTRON BEAMS

BACKGROUND OF THE INVENTION

This invention relates to an exposure apparatus of raster scanning type using an electron beam.

Shown in FIG. 1 is a known exposure apparatus of raster scanning type using electron beams. The exposure apparatus has a electron beam generator 2 which is driven by a scanning device 4 to generate an electron beam for scanning a test piece 6 put on a table 8 in the horizontal direction or X direction. The electron beam generator 2 is connected to receive dot pattern data which have been read out from a random access memory 10 by a central processing unit 12 and which have been supplied via a direct memory access 14 and a buffer 16. The table 8 is moved by a driver 18 which responds to clock pulses from a clock pulse generator 20. The scanning device 4 responds also to these clock pulses to drive the electron beam generator 2. Each time the electron beam generator 2 has generated an electron beam required for scanning one line extending in X direction, in accordance with the dot pattern data the driver 18 moves the table 8 by a one-line space distance in the vertical direction or Y direction and the scanning device 4 sets the electron beam generator 2 to an initial state for scanning the next line.

If adjacent lines are constituted by the same dot pattern data, the dot pattern data are repeatedly used to compress the data which are to be transferred from RAM 10 to the buffer 16, thus elevating pattern-drawing speed. In case a pattern includes a slant line, however, the dot pattern data vary for every line. Thus, it is impossible to continuously draw a slant line on the test piece 6. If different patterns are drawn on adjacent test pieces or chips by exposing the chips to an electron beam, the pattern-drawing speed is inevitably reduced. Further, in order to draw various patterns, a large amount of dot pattern data is required and it is required to use RAM 10 having a large memory capacity.

SUMMARY OF THE INVENTION

It is an object of this invention to provide an exposure apparatus using an electron beam, which uses a relatively small amount of pattern data and can yet draw various patterns at a high speed.

According to this invention there is provided an exposure apparatus using an electron beam which comprises memory means for storing pattern parameters representing various basic patterns, data processing means for reading from the memory means the pattern parameters representing the basic patterns to constitute a desired pattern, dot pattern data generating means for receiving the pattern parameters read out from the memory means by the data processing means and generating dot pattern data corresponding to the received pattern parameters, electron beam generating means for generating an electron beam in response to the dot pattern data supplied from the dot pattern data generating means to achieve a raster scanning on a predetermined region of a test piece.

BRIEF DESCRIPTION OF THE DRAWING

FIG. 10 shows a relationship between a 16-bit pattern data or dot pattern data and a 4-bit data which represents an X-axis position;

DETAILED DESCRIPTION OF THE PREFERRED EMBODIMENTS

Now referring to the accompanying drawings, exposure apparatus using electron beams according to this invention will be described.

Figure 1:
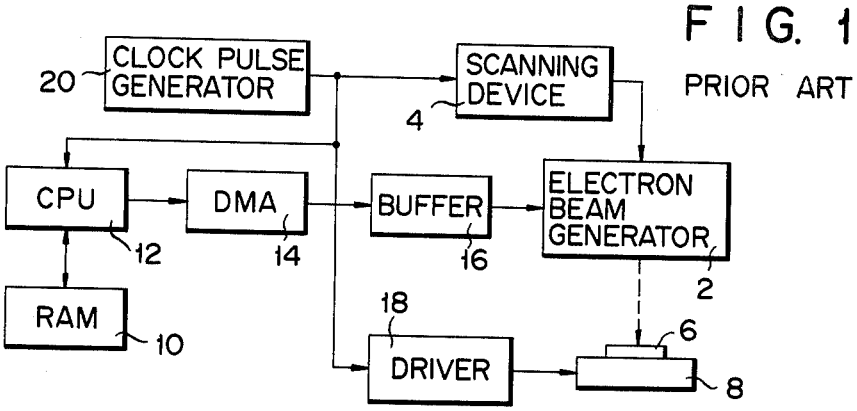
FIG. 1 is a block diagram of a known exposure apparatus using electron beams.
Figure 2:
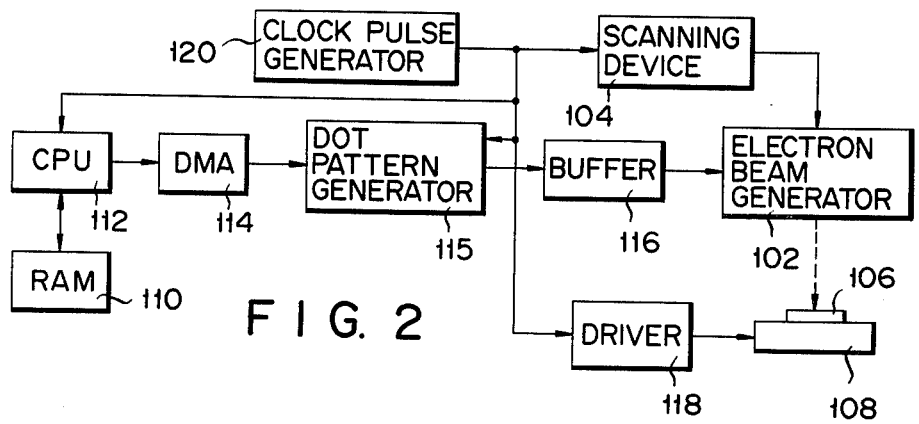
FIG. 2 is a block diagram of an exposure apparatus using an electron beam according to one embodiment of this invention.

Like the known exposure apparatus of FIG. 1, the embodiment of this invention shown in FIG. 2 has an electron beam generator 102 which is driven by a scanning device 104 to generate an electron beam for scanning a test piece 106 put on a table 108 in the horizontal direction or X direction. Pattern parameters read out from a random access memory (RAM) 110 by a central processing unit 112 are transferred via a direct memory access 114 to a dot pattern data generator 115. The pattern parameters read out from the RAM 110 are used to define the outline of a pattern to be drawn. The dot pattern data generator 115 converts the pattern parameters into dot pattern data, which are serially supplied to the electron beam generator 102 through a buffer circuit 116. The dot pattern data are used to define the area of the pattern to be drawn. The table 108 is moved in the vertical direction or Y direction by a driver 118 which responds to a clock pulse from a clock pulse generator 120. The scanning device 104 responds also to the clock pulse to drive the electron beam generator 102. Every time the electron beam generator 102 has generated an electron beam which corresponds to the dot pattern data defined by pattern parameters for one line extending in X direction, the driver 118 moves the table 108 by a one-line space distance in the vertical direction or Y direction. In this way a raster scanning is carried out for the test piece 106 to draw a desired pattern on the test piece 106.

The region of the test piece 106 which the electron beam generator 102 can scan is limited. Generally a pattern to be drawn on a test piece is separated into a number of unit pattern areas arranged in a matrix array. The X-axis and Y-axis sides of each unit pattern area are, for example, each 512 bits long. In this case, the unit pattern area may correspond to a memory area with a storing capacity of about 256 kilobits ($=512\times512$).

Figure 3:
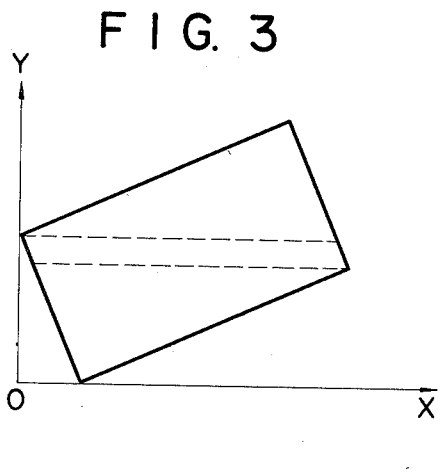
FIGS. 3 and 4 each illustrate a basic pattern.
Figure 4:
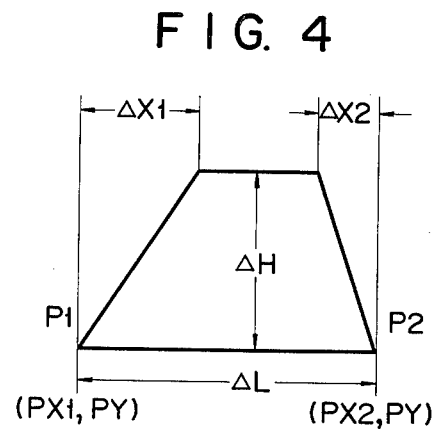

A polygonal pattern drawn on a unit pattern area is divided into several basic patterns each having a side or sides parallel to X-axis, such as triangles, squares, rectangles, parallelograms and trapezoids. For example, such an inclined rectangular pattern as shown in FIG. 3 is divided by two lines both parallel to X-axis into two triangular basic patterns and one parallelogram basic pattern. A trapezoid is a useful basic pattern since pattern parameters used for defining the trapezoid can also be used to define other various basic patterns. As shown in FIG. 4, only if one of the corners of the trapezoid is given as coordinate P1 (PX1, PY), the trapezoid can be represented by four pattern parameters, i.e. base length $\Delta L$, height $\Delta H$, distance $\Delta X1$ between one end of the base and one end of the upside, and distance $\Delta X2$ between the other end of the base and the other end of the upside. Using these pattern parameters, basic patterns other than a trapezoid can be defined. For instance, a triangle is represented when $\Delta X1+\Delta X2=\Delta L$, and a square is defined when $\Delta X1=\Delta X2=0$ and $\Delta L=\Delta H$. If each pattern parameter is represented by, for example, 12 bits of a 16-bit word, a trapezoidal basic pattern is defined by six words representing PX, PY, PX2, $\Delta H$, $\Delta X1$ and $\Delta X2$, respectively, and a square basic pattern by three words representing PX, PY and PX2, respectively.

If a desired pattern is drawn on the pattern region of an LSI wafer or photomask by exposing the wafer or photomask to an electron beam, each unit pattern area of the pattern region usually includes 200 to 300 basic patterns. This means that the amount of pattern data necessary to define 200 to 300 basic patterns in each unit pattern area is about one-tenth of the amount of dot pattern data required to represent 200 to 300 basic patterns. RAM 110 separately stores the pattern data for every unit pattern area.

Figure 5:
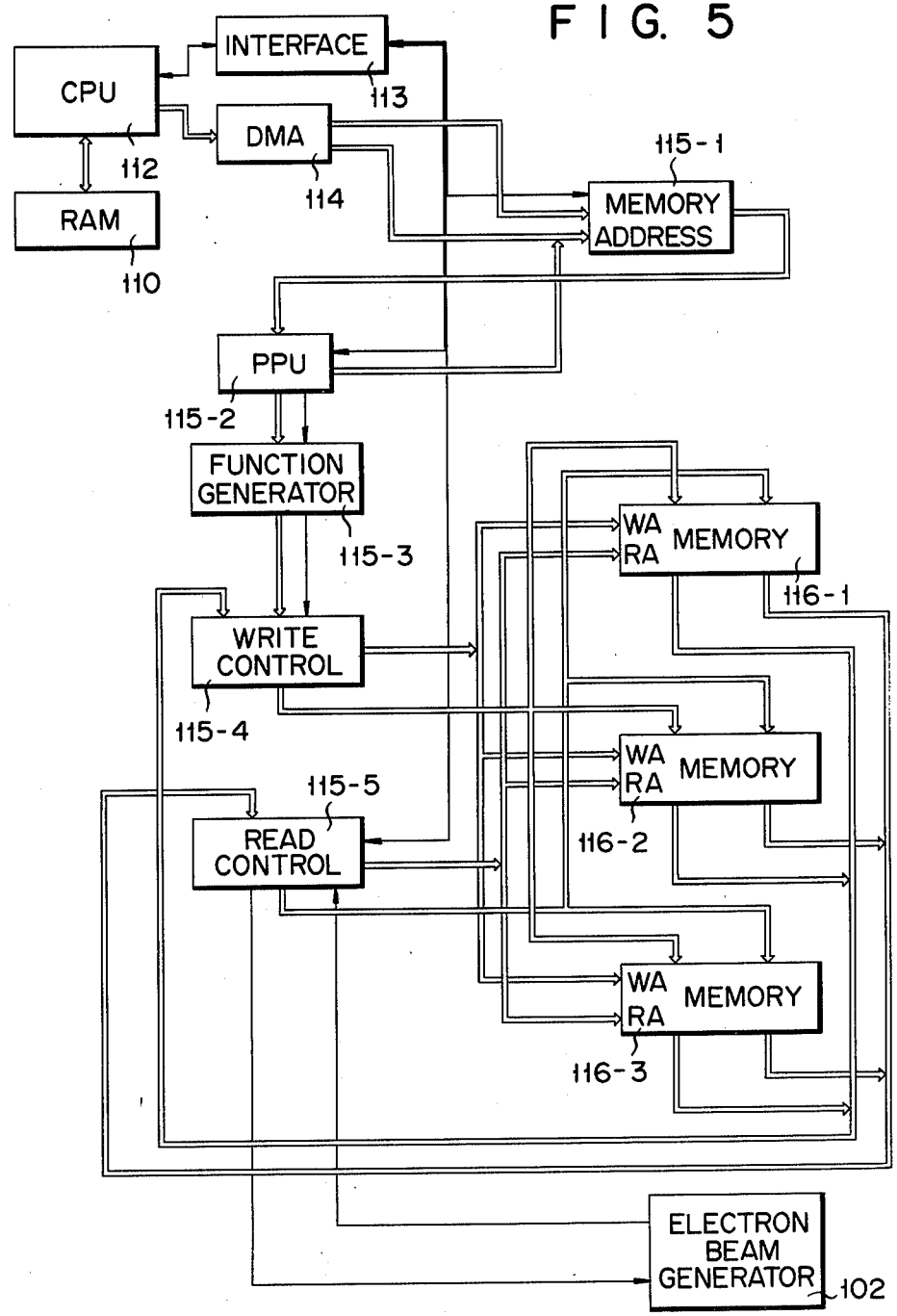
FIG. 5 is a block diagram of a main part of the exposure apparatus shown in FIG. 2.

As illustrated in FIG. 5, the dot pattern generator 115 includes a memory 115-1, a pre-processing unit 115-2, a function generator 115-3, a write control unit 115-4 and a read control unit 115-5 which are all controlled by a control signal supplied from CPU 112 through an interface circuit 113. As shown also in FIG. 5, the buffer circuit 116 includes three memories 116-1 to 116-3 each having a storing capacity of $512\times512$ bits.

To draw a desired pattern on the pattern region of the test piece 106, CPU 112 supplies a write-in signal to the memory 115-1 via the interface circuit 113, thereby bringing the meory 115-1 into writing state. At the same time, CPU 112 reads out from RAM 110 the pattern data which include pattern parameters PX1, PY, $\Delta X1$, $\Delta X2$, $\Delta L$ and $\Delta H$ and which represent the basic patterns contained in the first unit pattern area. These pattern data are transferred to the memory 115-1 via DMA 114. Thus the memory 115-1 stores the pattern data which is used to represent the outline of each basic pattern included in the first unit pattern area. Then, in response to a control signal from CPU 112 the pre-processing unit 115-2 supplies an address signal to the memory 115-1. Upon receipt of the address signal the memory 115-1 starts sequentially delivering the pattern parameters of the first basic pattern in the first unit pattern area and processing them as will be described later to generate parameters PX1, PX2, PY, $\Delta X1$, $\Delta X2$ and $\Delta H$.

In response to a control signal from the pre-processing unit 115-2, the function generator 115-3 receives parameter data required for defining the outline of the basic pattern from the pre-processing unit 115-2 and processes these parameter data as will be described later to generate bit pattern data which represents the region defined by the sides of the basic pattern represented by these received parameter data.

In response to a control signal from the function generator 115-3, the write control unit 115-4 designates the address of one of the memory sections 116-1 to 116-3 and then writes into the designated memory the dot pattern data according to the bit pattern data generated by the function generator 115-3. When all the dot pattern data corresponding to the basic patterns to be drawn in the first unit pattern area are written into the designated memory, PPU 115-2 starts reading from memory 115-1 the pattern data which represent the basic patterns to be drawn on the second unit pattern area of the test piece 106. At the same time, in response to a control signal from CPU 112 the read control unit 115-5 starts reading the dot pattern data from the designated memory and supplying them to the electron beam generator 102. Then, the electron beam generator 102 generates an electron beam the intensity of which has been modulated according to the dot pattern data which represent the basic patterns to be drawn on the first unit pattern area. Then, the electron beam scans the test piece 106 (FIG. 2) to draw a desired pattern on the test piece 106.

Figure 6:
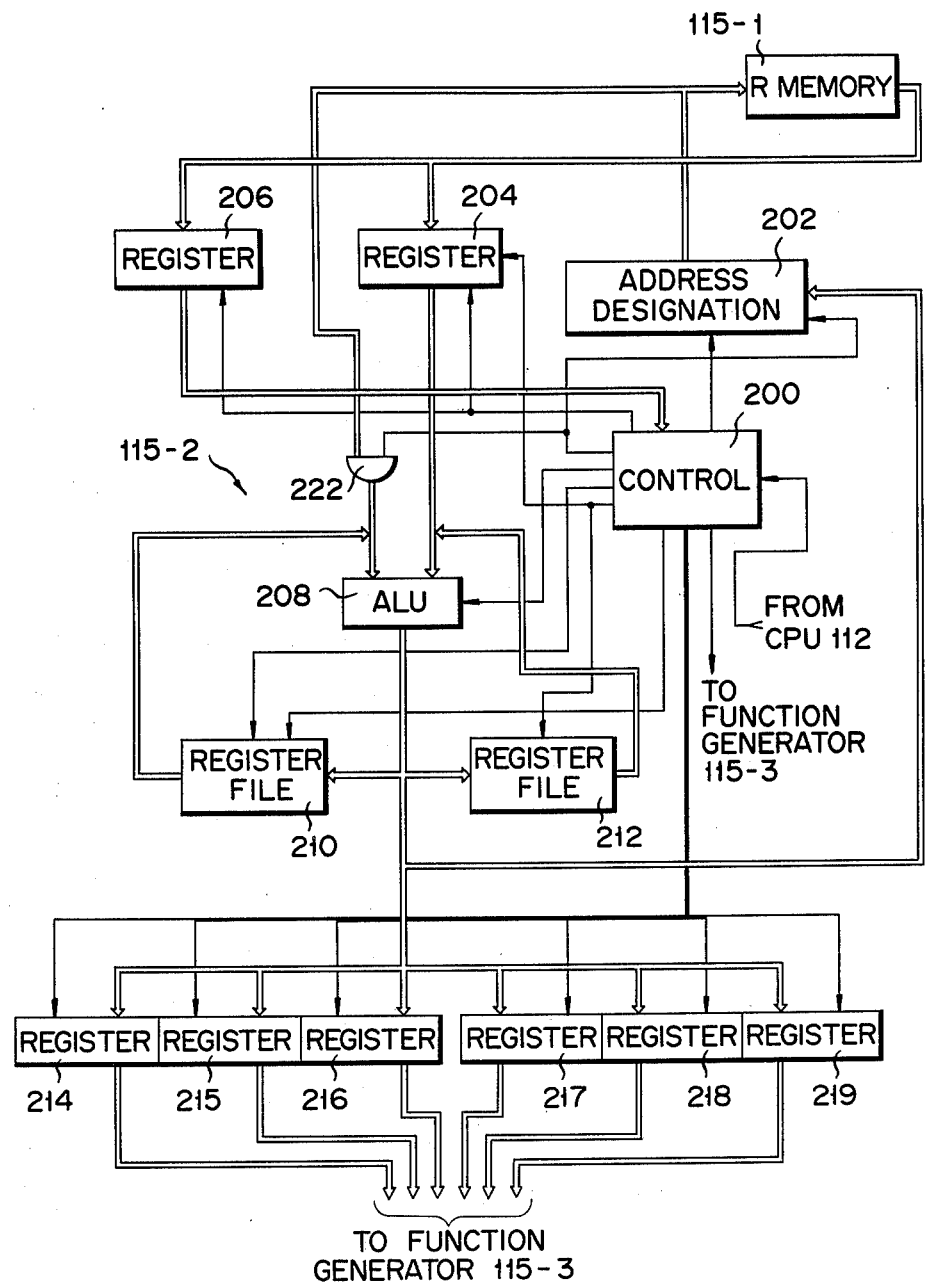
FIG. 6 is a circuit diagram of a pre-processing unit which is used in the exposure apparatus shown in FIG. 5.

The pre-processing unit 115-2 has such a structure as shown in FIG. 6. That is, the pre-processing unit 115-2 includes a control unit 200 for producing various control signals in response to a control signal from CPU 112, an address designation circuit 202 for supplying an address signal to the memory 115-1 in response to an address control signal from the control unit 200, a register 204 for receiving 12 lower bits of a 16-bit word read out from the memory 115-1, which represent one pattern parameter, a register 206 for receiving the remaining 4 bits of the 16-bit word, which represent a command data, and an arithmetic logic unit (ALU) 208 for receiving an output data from the register 204 at its first input port. A 12-bit output data of ALU 208 is supplied to a register files 210 and 212, the address designation circuit 202 and registers 214 to 220. The output data of the register file 210 are supplied to the second input port of ALU 208, and the output data of the register file 212 to the first input port of ALU 208. Coupled to the second input port of ALU 208 is the output terminal of an AND gate 222 which is enabled by a jump control signal from the control unit 200 to deliver the data stored in the address designation circuit 202.

Figures 7, 8, 9:
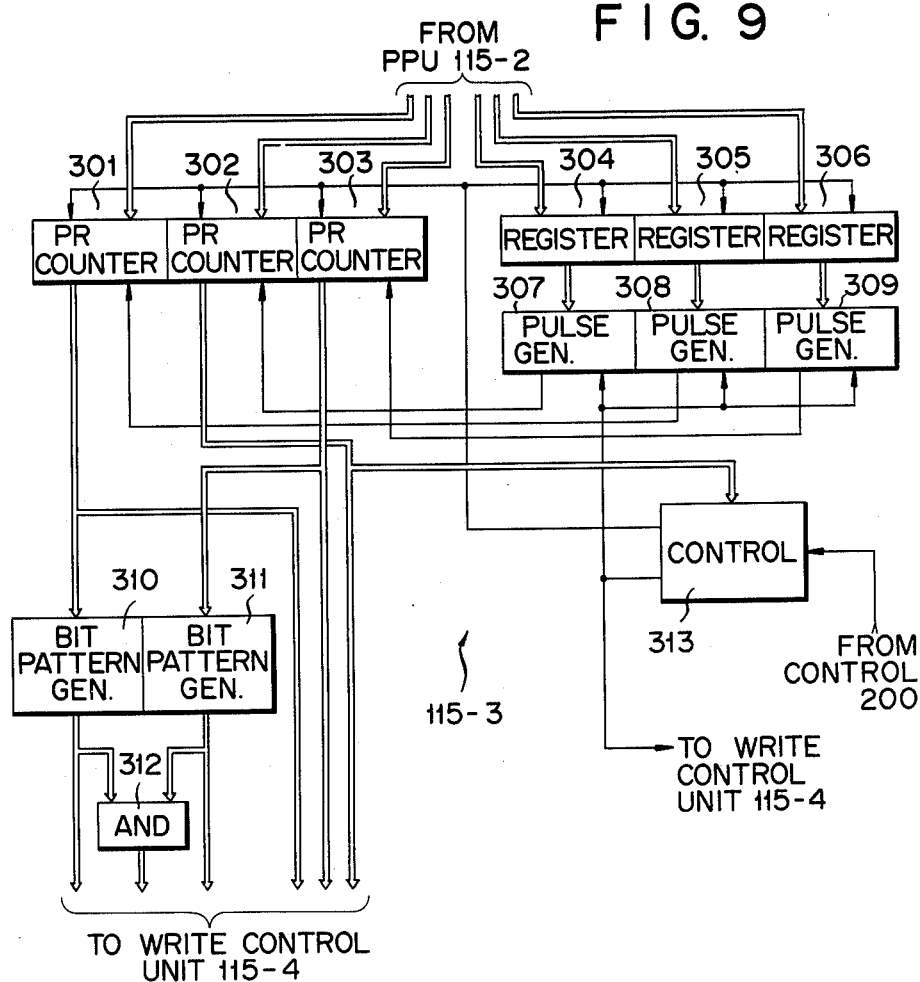
FIGS. 7 and 8 each illustrate basic pattern data.
FIG. 9 is a block diagram of a function generating circuit which is used in the exposure apparatus shown in FIG. 5.

In response to a control signal from CPU 112 the control unit 200 generates an address control signal. Upon receipt of the address control signal from the control unit 200 the address designation circuit 202 designates the first address position of the memory 115-1, whereby the memory 115-1 delivers a first 16-bit word which contains a command data and the reference X-axis coordinate data PX1. The first to fourth upper bits of the 16-bit word constitute the command data, the fifth bit indicates the sign of the coordinate value, the sixth to 14th bits represent the integral portion of the coordinate value, and the last two bits represent the fractional portion of the coordinate value. The first to fourth upper bits of the word, i.e. command data, are transferred to the register 206 and then to the control unit 200. According to the command data from the register 206 the control unit 200 determines a process mode for processing the parameter data delivered from the memory 115-1. If the command data is, for example, a location absolute data (LOCA) as shown in FIGS. 7 and 8, which is used to determine the reference coordinate, the control unit 200 feeds an operation instruction signal to ALU 208 and supplies an enable signal to the register file 210 and the register 214, so that the 12-bit data from the register 204 or the reference X-axis coordinate data PX1, is stored into the register file 210 and the register 214 through ALU 208.

After producing an enable signal to the registers 204 and 206, the control unit 200 supplies an address control signal to the address designation circuit 202. In response to the address control signal the address designation circuit 202 designates the second address position of the memory 115-1. The memory 115-1 therefore delivers a second 16-bit word containing the reference Y-axis coordinate data PY. The 12 bits of the second word which represent the data PY are stored into the register 204. The output data of the register 204, which represent the data PY, is supplied to ALU 208. Thereafter, the control unit 200 feeds an operation instruction signal to ALU 208 and supplies an enable signal to the register 215 and register file 210, so that the data PY is written into the register 215 and register file 210 through ALU 208.

After producing an enable signal to the register 204, the control unit 200 supplies an address control signal to the address designation circuit 202. In response to this address control signal the address designation circuit 202 designates the third address position of the memory 115-1. The memory 115-1 therefore delivers a third 16-bit word containing the command data and the pattern parameter $\Delta L$. The first four bits of the third word, which represent the command data, are stored into the register 206. The output data of the register 206, i.e. command data, is supplied to the control unit 200. According to the command data from the register 206 the control unit 200 determines a process mode for processing the pattern data read out from the memory 115-1. If the command data is, for example, a data TRPZ which represents, as shown in FIG. 7, a trapezoidal basic pattern, the parameters $\Delta L$, $\Delta H$, $\Delta X1$ and $\Delta X2$ are necessary. If the command data is a data SQAR which represents, as shown in FIG. 8, a square basic pattern, only the parameter $\Delta L$ is required. If the command data represents a triangular basic pattern, a set of parameters $\Delta L$, $\Delta H$ and $\Delta X1$ are required. If it represents a rectangular basic pattern, a set of parameters $\Delta L$ and $\Delta H$ are necessary.

Suppose the data stored in the register 206 is data TRPZ which represents a trapezoidal basic pattern. Then, the control unit 200 which has received the command data TRPZ from the register 206 supplies an operation instruction signal to ALU 208 and, at the same time, an enable signal to the register file 210 and the register 216. ALU 208 adds the base length parameter $\Delta L$ from the register 204 to the reference X-axis coordinate data PXI from the register file 210 thereby to deliver an X-axis coordinate data PX2 ($=PX1+\Delta L$). The X-axis coordinate data PX2 is written into the register 216 and register file 210.

After producing an enable signal to the registers 204 and 206, the control unit 200 supplies an address control signal to the address designation circuit 202. In response to the address control signal the address designation circuit 202 designates the fourth address position of the memory 115-1. A fourth 16-bit word containing the height parameter data $\Delta H$ is therefore delivered from the fourth address position of the memory 115-1. The height parameter data $\Delta H$ is stored into the register 204. The output of the register 204, which represents the parameter data $\Delta H$, is supplied to ALU 208. The control unit 200 thereafter feeds an operation instruction signal to ALU 208 and, at the same time, supplies an enable signal to the register 217 and register file 210, so that the parameter data $\Delta H$ is read out from ALU 208 and written into the register 217 and register file 210.

After producing an enable signal to the register 204, the control unit 200 supplies an address control signal to the address designation circuit 202. In response to this address control signal the address designation circuit 202 designates the fifth address position of the memory 115-1. A fifth 16-bit word containing the parameter data $\Delta X1$ is delivered from the fifth address position of the memory 115-1. The parameter data $\Delta X1$ is stored into the register 204. The output data of the register 204, which represents the parameter data $\Delta X1$, is supplied to ALU 208. Thereafter, the control unit 200 feeds an operation instruction signal to ALU 208 and an enable signal to the register 218 and register file 210, thereby writing the parameter data $\Delta X1$ into the register 218 and register file 210 through ALU 208.

After producing an enable signal to the register 204, the control unit 200 generates an address control signal. In response to this address control signal the address designation circuit 202 designates the sixth address position of the memory 115-1. Then, a sixth 16-bit word containing the parameter $\Delta X2$ is delivered from the sixth address position of the memory 115-1. The parameter data $\Delta X2$ which is formed of 12 bits is stored into the register 204. The output data of the register 204, which represents the parameter data $\Delta X2$, is supplied to ALU 208. Then, the control unit 200 feeds an operation instruction signal to ALU 208 and an enable signal to the register 219 and register file 210, thereby writing the parameter data $\Delta X2$ into the register 219 and register file 210 through ALU 208.

If the command data supplied together with the parameter data $\Delta L$ is command data SQAR which represents a square basic pattern (FIG. 8), the control unit 200 gives an enable signal to the register file 210 and the register 216 and an operation instruction signal to ALU 208 when the parameter data $\Delta L$ is stored into the register 204. ALU 208 therefore, delivers X-axis coordinate data PX2 ($=PX1+\Delta L$), which is stored into the register 216 and register file 210. This done, the control unit 200 supplies an operation instruction signal to ALU 208 and an enable signal to the register 217 and register file 210, whereby the parameter data $\Delta L$ is transferred from the register 204 through ALU 208 to the register 217 and register file 210. Thereafter, the control unit 200 supplies an inhibit signal to the register 204 and an enable signal to the register file 212, whereby a constant data which represents "0" and which has been stored in the register file 212 is delivered from the register file 212 via ALU 108. At the same time, the control unit 200 feeds an enable signal to the registers 218 and 219 and register file 210, whereby the constant data "0" is supplied through ALU 208 to the register 218 and register file 210 as a parameter data ΔX1 and to the register 219 and register file 210 as a parameter data ΔX2. After the various data have been stored into the registers 214 to 219 in this way, the control unit 200 feeds a control signal to the function generator 115-3.

If the command data stored in the register 206 is a "JUMP" command, the control unit 200 supplied a jump control terminal of the address designation circuit 202, a jump control terminal of the AND gate 222 and a jump control terminal of ALU 208. As a result, the address data stored in the address position of the memory 115-1 which is designated by the circuit 202 is added to the address data which is stored in the register 204 and which is to jump. The address data which is the result of this address is written into the address designation circuit 202, and based on this newly written address data an address position of the memory 115-1 is designated.

The function generator 115-3 has a structure such as shown in FIG. 9. It has three presettable counters 301, 302 and 303 which are coupled to the registers 214, 215 and 216 of the pre-processing unit 115-2, respectively and three registers 304, 305 and 306 which are coupled to the registers 217, 218 and 219 of the pre-processing unit 115-2, respectively. The output terminals of these registers 304 to 306 are coupled to pulse generators 307 to 309, respectively. The pulse generator 307 generates a pulse signal of a frequency corresponding to the contents of the register 304 to the presettable counter 302. The pulse generator 308 generates a pulse signal of a frequency corresponding to the contents of the register 305 to the presettable counter 301. And the pulse generator 309 generates a pulse signal of a frequency corresponding to the contents of the register 306 to the presettable counter 303. The output terminal of the presettable counter 301 is connected to a bit pattern generator 310 whose output terminal is coupled to an AND circuit 312. The output terminal of the presettable counter 303 is connected to another bit pattern generator 311 whose output terminal is coupled also to the AND circuit 312. The presettable counters 301 to 303, registers 304 to 306 and pulse generators 307 to 309 are controlled by a control unit 313. The control unit 313 is connected to receive a control signal from the control unit 200 of the pre-processing unit 115-2.

Upon receipt of a control signal from the control unit 200 the control unit 313 supplies an enable signal to the presettable counters 301 to 303 and the registers 304 to 306. As a result, the coordinate data which are each represented by 11 bits of the registers 214 to 216 of the pre-processing unit 115-2 are transferred to the registers 304 to 306, respectively. The pulse generators 307 to 309 supply pulse signals to the presettable counters 302, 301 and 303, respectively. That is, the presettable counter 302 counts the contents of the register 304, up or down according to the sign of the parameter data ΔX1 and at a rate according to the contents of the register 304. Similarly, the presettable counter 301 counts the contents of the register 305, up or down according to the sign of the parameter data ΔX2 and at a rate according to the contents of the register 305, and the presettable counter 303 counts the contents of the register 306, up or down according to the sign of the parameter data ΔH and at a rate according to the contents of the register 306. Though not shown, the counting modes of these presettable counters 302, 301 and 303 are determined by the control unit 313 according to the contents of the registers 304, 305 and 306, respectively.

Figure 10:
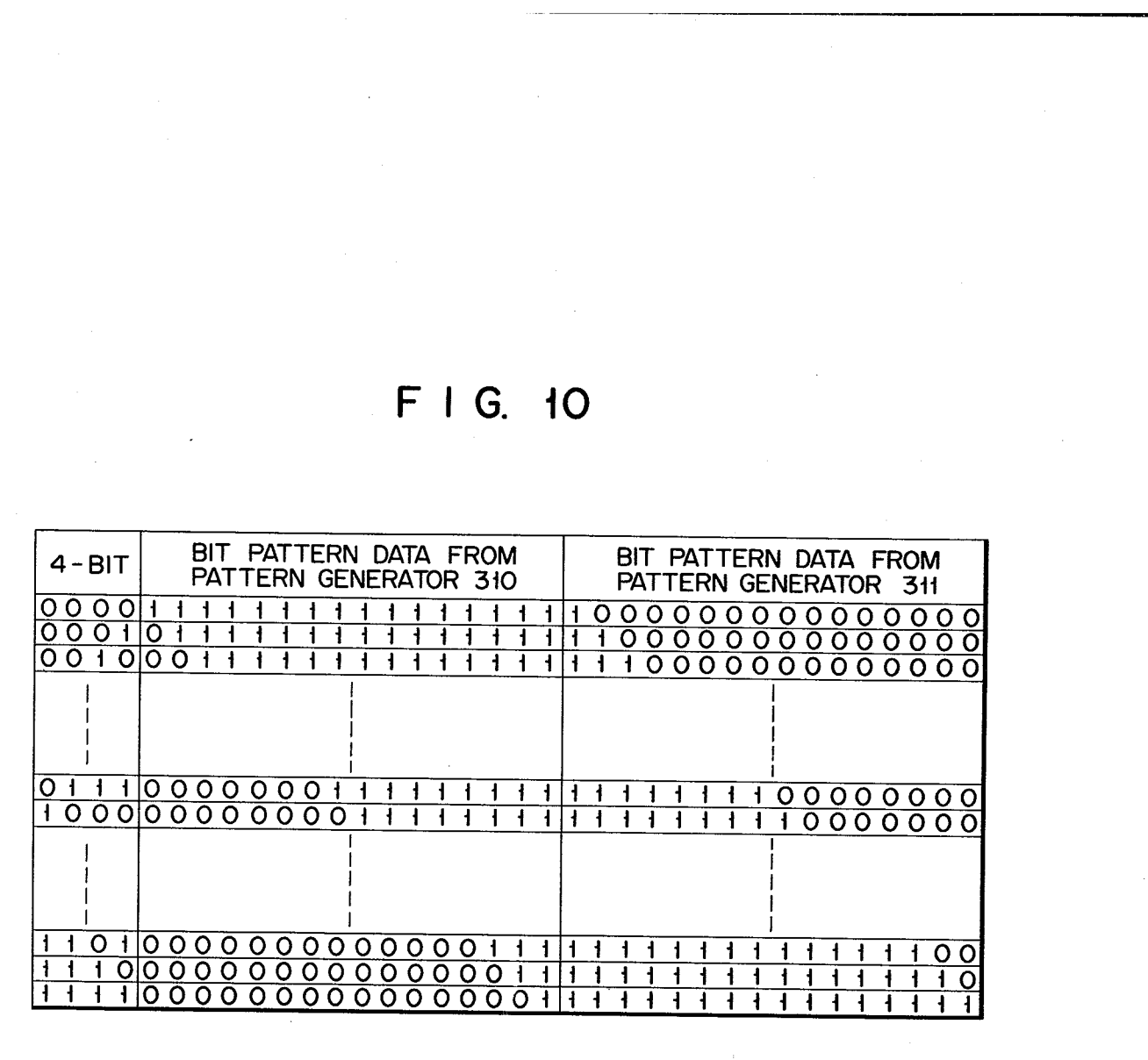

The control unit 313 reads the contents of the presettable counter 302. Every time it detects that the last two bits of the contents of the counter 302 are "0" or that the electron beam shifts from one scanning line to the next one, the control unit 313 supplies a stop signal to the pulse generators 307 and 309. A bit data including the sixth to ninth bits of the count of the presettable counter 301 and representing the left end position of a basic pattern is transferred through the bit pattern generator 310 to the write control unit 115-4. Similarly, a bit data including the sixth to ninth bits of the count of the presettable counter 303 and representing the right end of the basic pattern is transferred through the bit pattern generator 311 to the write control unit 115-4. According to the sixth to ninth bits of the count of the counter 301 the bit pattern generator 310 produces such 16-bit pattern data as shown in FIG. 10. According to the sixth to ninth bits of the count of the counter 303 the bit pattern generator 311 produces such 16-bit pattern data as illustrated in FIG. 10. The bit pattern data are supplied to the AND circuit 312 from the bit pattern generators 310 and 311. The bit pattern data from the bit pattern generators 310 and 311 and the bit pattern data from the AND circuit 312 are transferred to the write control unit 115-4. Also transferred to the write control unit 115-4 are a word position data which is formed of the first five bits of the output data of the presettable counter 301 and which represents the X-axis position of a word on one electron beam scanning line, a word position data which is formed of the first five bits of the output data of the presettable counter 303 and which represents the X-axis position of a word on the electron beam scanning line, and a Y-axis coordinate data which is formed of the first nine bits of the output data of the presettable counter 302 and which represents the Y-axis position of the electron beam scanning line. Further, an enable signal is supplied as control signal from the control unit 313 to the write control unit 115-4.

Figure 11:
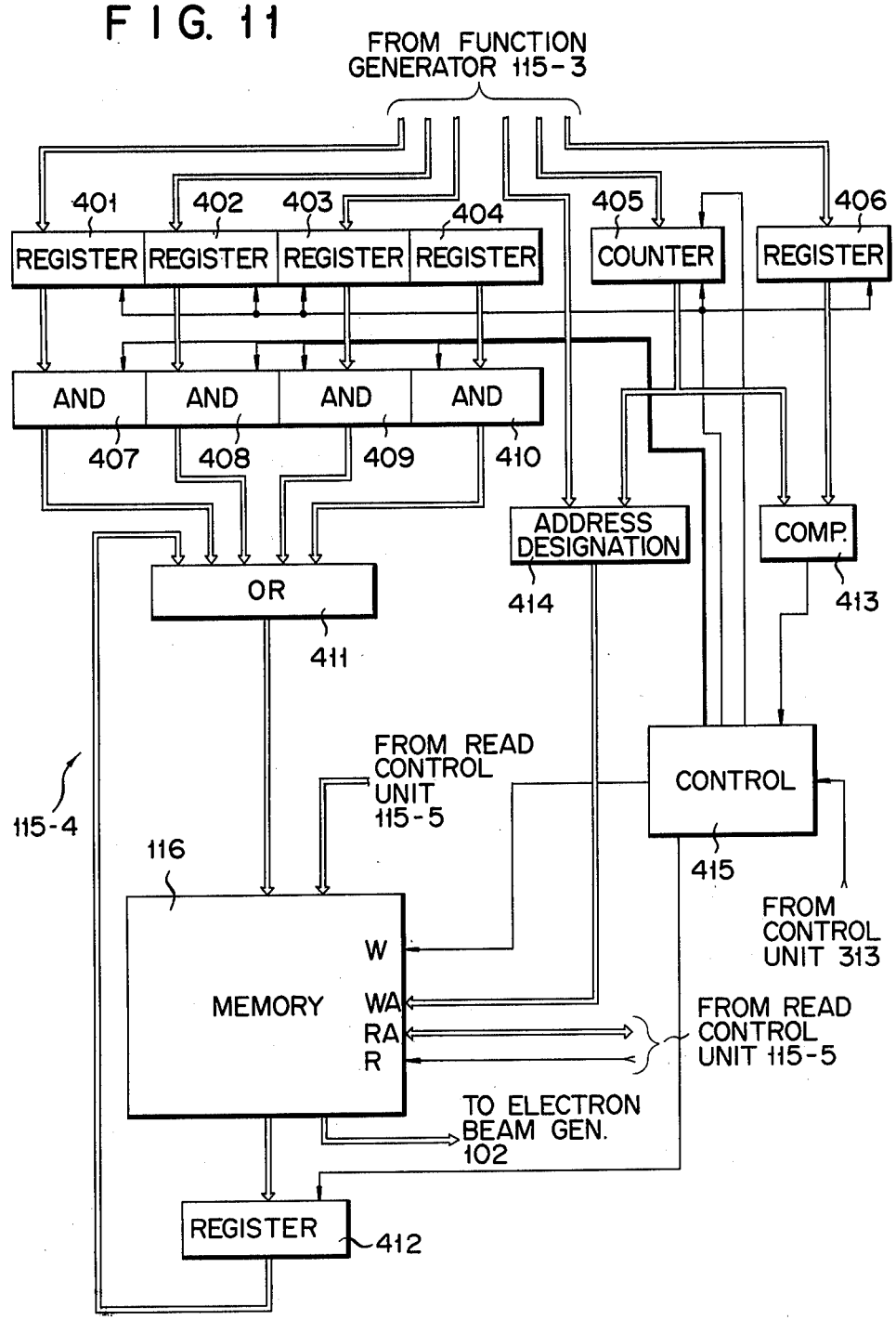
FIG. 11 shows the connection between a memory and a write control unit which are used in the exposure apparatus shown in FIG. 5.

FIG. 11 illustrates how the memory 116 and the write control unit 115-4 both shown in FIG. 5 are coupled to each other. The write control unit 115-4 includes three registers 401 to 403, a register 404 for producing a 16-bit data including 16 "1" bits, and two presettable counters 405 and 406 for receiving the count data from the presettable counters 301 and 303, respectively. The registers 401, 402 and 403 receive the bit pattern data from the bit pattern generators 310 and 311 and AND circuit 312 of the function generator 115-3. The output data of the registers 401 to 404 are supplied to the memory 116 through AND circuits 407 to 410, respectively and then through an OR circuit 411. The output data of the memory 116 is supplied to a register 412 whose output terminal is coupled to the OR circuit 411. The output count data of the presettable counter 405 is supplied to a comparator 413 together with the output data of the register 406 and also to an address designation circuit 414 together with the output count data of the presettable counter 302 of the function generator 115-3. The registers 401 to 403, 406 and 412 and presettable counter 405 and AND circuits 407 to 410 are controlled by a control circuit 415.

Upon receipt of a control signal from the control unit 313 of the function generator 115-3, a control unit 415 supplies an enable signal to the registers 401 to 404 and 406, and the presettable counter 405. As a result, the bit pattern data are stored into the registers 401, 402 and 403 from the bit pattern data 310, AND circuit 312 and bit pattern data 311 of the function generator 115-3, respectively. At the same time, the 5-bit count data which represents the X-axis position of a word containing a bit showing a point on the left side of the basic pattern is preset from the presettable counter 301 into the presettable counter 405. Further, the 5-bit count data which represents the X-axis position of the word containing a bit showing a point on the right side of the basic pattern is stored from the presettable counter 303 into the register 406. The output count data LA of the presettable counter 405 is compared by the comparator 413 with the 5-bit data RA stored in the register 406.

Figure 12:
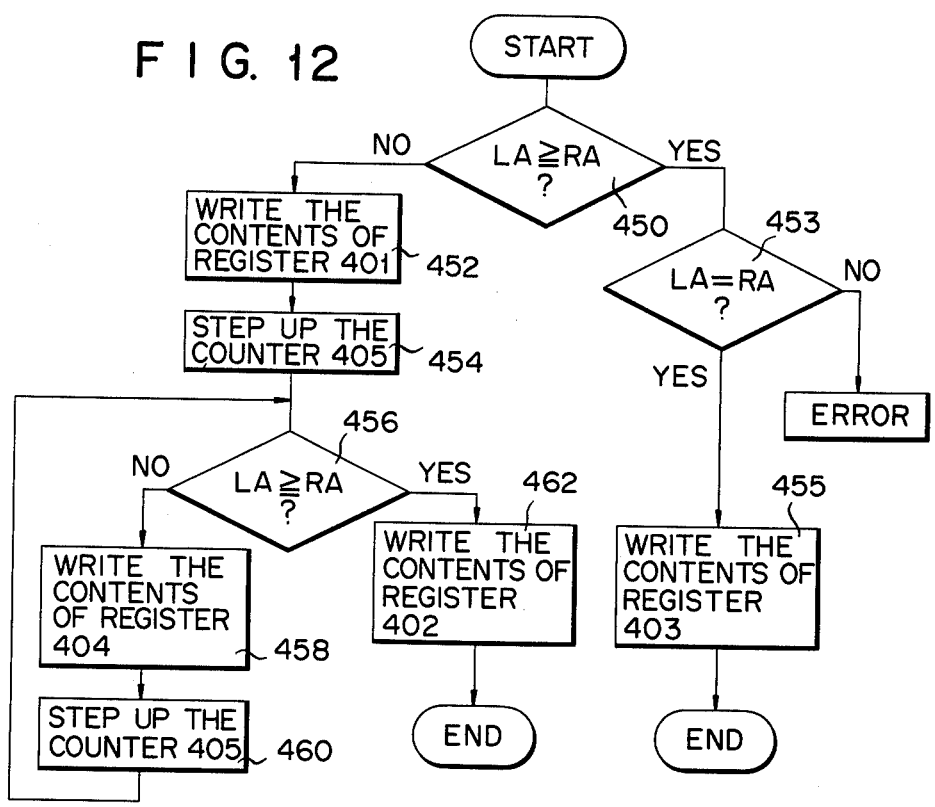
FIG. 12 is a flow chart illustrating how the write control unit shown in FIG. 11 operates.

This data comparison is denoted as process 450 in a flow chart of FIG. 12 and carried out to detect whether the data LA is larger than, or equal to, the data RA. If the data LA is smaller than the data RA, the control unit 415 supplies an enable signal to AND circuits 407 and register 412 and a write-in command signal to the memory 116. In this case, the address designation circuit 414 receives a 9-bit data which represents the Y-axis position of a word and which has been delivered from the presettable counter 302 of the function generator 115-3 and a 5-bit data which represents the X-axis position of the word and which has been delivered from the presettable counter 405. The address designation circuit 414 produces a 14-bit address data and supplies the same to the memory 116. The address data designates one of the address positions of the memory 116. Then, the bit pattern data stored in the designated address position is written again into the same address position via the OR circuit 411 and, at the same time, the bit pattern data stored in the register 401 is written into the designated address position through the OR circuit 411, thus carrying out process 452 in the flow chart of FIG. 12.

Upon completion of process 452, the control unit 415 supplies a count-up pulse to the presettable counter 405, thus stepping up the contents of the counter 405 by one count. This operation is denoted as process 454 in the flow chart of FIG. 12. The count data of the counter 405 is compared with the data stored in the register 406, thus effecting process 456, to detect whether these input data are equal or not. If the comparator 413 detects that the count data of the counter 405 is larger than that of the register 406, the control unit 415 supplies an enable signal to the AND circuit 410 and register 412 and then a write-in command signal to the memory 116. In this case, the address designation circuit 414 receives the same Y-axis position data and an X-axis position data which represents the X-axis position of a word next to the preceding word in X direction. Then, the contents of the register 404 containing 16 "1" are written into the memory 116 through the AND circuit 410 and the OR circuit 411, thus conducting process 458. Upon completion of process 458, the control unit 415 supplies a count-up pulse to the presettable counter 405, thus stepping up the contents of the counter 405 by one count. That is, process 460 is carried out. The contents of the counter 405 are compared again with those of the register 406. If the count data of the counter 405 is found still smaller than that of the register 406, processes 458 and 460 are repeated until the count data of the presettable counter 405 becomes equal to or larger than that of the register 406. When the comparator 413 detects that the count data of the counter 405 is equal to that of the register 406, the control unit 415 supplies an enable signal to the AND circuits 408 and register 412 and then a write-in command signal to the memory 116, whereby process 462 is carried out to write the count data of the register 402 into the memory 116, completing the data process.

If at process 450 the count data LA of the counter 405 is detected to be larger than, or equal to, the data RA stored in the register 406, the control unit 415 detects based on the output signal of the comparator 413 whether the data LA is equal to the data RA at process 453. If the data LA and RA are found equal, the control unit 415 feeds an enable signal to the AND circuit 409 and register 412 and then a write-in command signal to the memory 116, whereby the data stored in the register 403 is written into the memory 116 through the AND circuit 409 and the OR circuit 411, completing the data process. If the data LA and RA are found different at process 452, the control unit 415 generates an error signal.

The above-mentioned operation is repeated to write into the memory 116 a word representing a point on the left side of a basic pattern, a word representing a point on the right side of the basic pattern, and all the words between these words. Thus, a one-line word data which represents a portion of one basic pattern is stored into the memory 116. This done, the control unit 313 of the function generator 115-3 generates another control signal. In response to this control signal, the control unit 415 starts operating to generate such various control signals as mentioned above. These control signals serve to enter into the memory 116 another one-line word data which represents the next portion of the basic pattern. When the memory 116 stores line word data representing a plurality of portions whose number corresponds to the parameter $\Delta H$, the write in operation into the memory 116 is completed.

Figure 13:
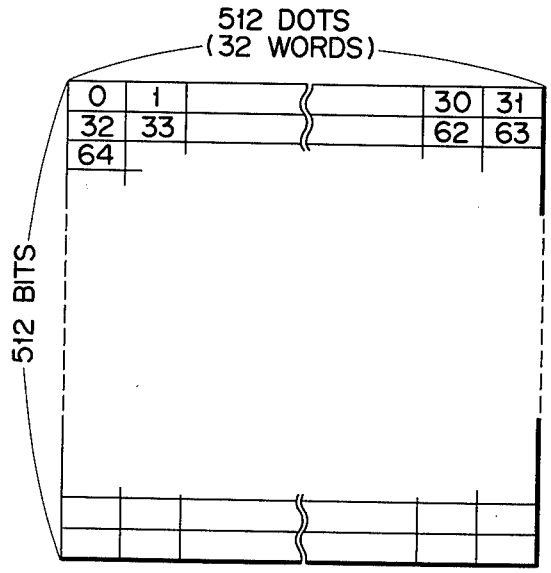
FIG. 13 represents the address positions of each memory used in the exposure apparatus shown in FIG. 5.
Figure 14:
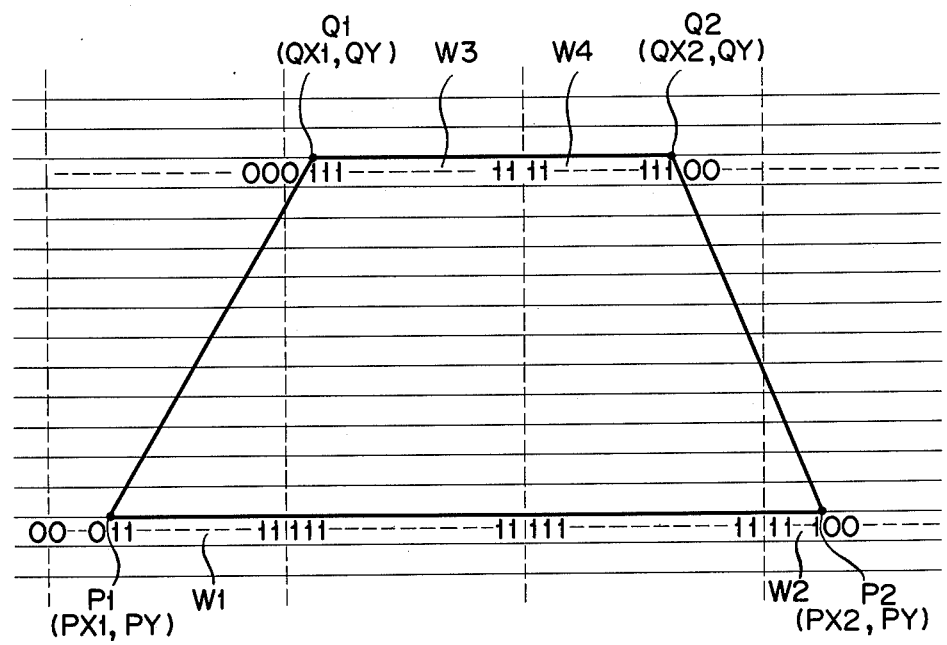
FIG. 14 illustrates bit pattern data which are stored into the memory shown in FIG. 13 when a trapezoidal pattern data is processed.

As shown in FIG. 13, each of the memory sections 116-1, 116-2 and 116-3 of the memory 116 has a storing capacity of 512 dots×512 dots, i.e. 32×512 words (1 word=16 bits). Suppose a trapezoidal basic pattern occupies a first unit pattern area of a pattern to be drawn on the test piece 106, as illustrated in FIG. 14. Then, coordinates (PX1, PY) (PX2, PY), (QX1, QY) and (QX2, QY) corresponding to the corners P1, P2, Q1 and Q2 of the basic pattern are obtained first. The address of a word W1 containing a first bit which corresponds to P1 and the address of a word W2 containing a second bit which corresponds to P2 are detected. The positions of the first and second bits of the words W1 and W2 are written into corresponding bit positions of the memory section 116-1. Then, "1" bits are written in all the bit positions between the bit positions where the first and second bits of the words W1 and W2 are stored, respectively. Thereafter the words or dot pattern data on the next line are processed in a similar way. This data processing is repeated until the address of a word W3 containing a third bit which corresponds to Q1 and the address of a word W4 containing a fourth bit which corresponds to Q2 are detected, the positions of these bits are written into the memory section 116-1, and "1" bits are written in all the bit positions between the bit positions where the third and fourth bits of the words W3 and W4 are stored. Thus ends the writing operation to the memory section 116-1. That is, the memory section 116-1 stores "1" bits at its bit memory positions which correspond to the region enclosed by sides of the trapezoidal basic pattern shown in FIG. 14. The "1" bits stored in the memory section 116-1 constitute a pattern data for the first unit pattern area of the pattern to be drawn on the test piece 106.

Once such a pattern data has been stored into the memory section 116-1, the pre-processing unit 115-2 reads from memory 115-1 the pattern data which correspond to a second unit pattern area. These pattern data are processed in the same manner as described before, and the words which include 16-bit dot pattern data corresponding to the pattern data are written into the memory section 116-2. At this time CPU 112 supplies a control signal to the read control unit 115-5 in synchronism with a pulse from the clock pulse generator 120. Upon receipt of the control signal the read control unit 115-5 starts sequentially supplying address signals to the memory 116-1, whereby the dot pattern data are read out from the memory 116-1 one after another. The dot pattern data are supplied to the electron beam generator 102. Every time it receives a "1" bit signal, the electron beam generator 102 projects an intense electron beam onto the test piece 106. Every time it receives a "0" bit signal, it projects a weak or no electron beam onto the test piece 106. In this way a basic pattern in the first unit pattern area is drawn on the test piece 106 according to the pattern data read out from RAM 110.

When all the pattern data corresponding to the second unit pattern area are written into the memory section 116-2 the memory section 116-3 starts receiving pattern data corresponding to the third unit pattern area. On the other hand, the read control unit 115-5 starts reading out data from the memory 116-2 after having read out data from the memory 116-1.

Figure 15:
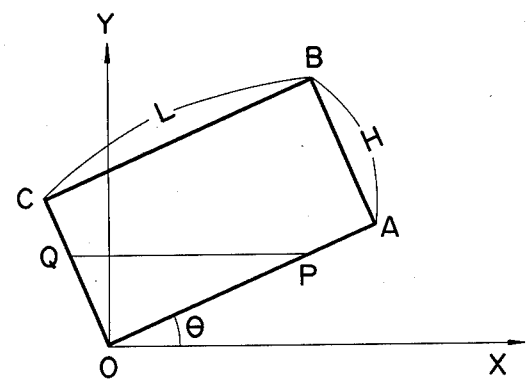
FIG. 15 shows a rectangular pattern which can be processed by an exposure apparatus according to another embodiment of this invention.
Figure 16:
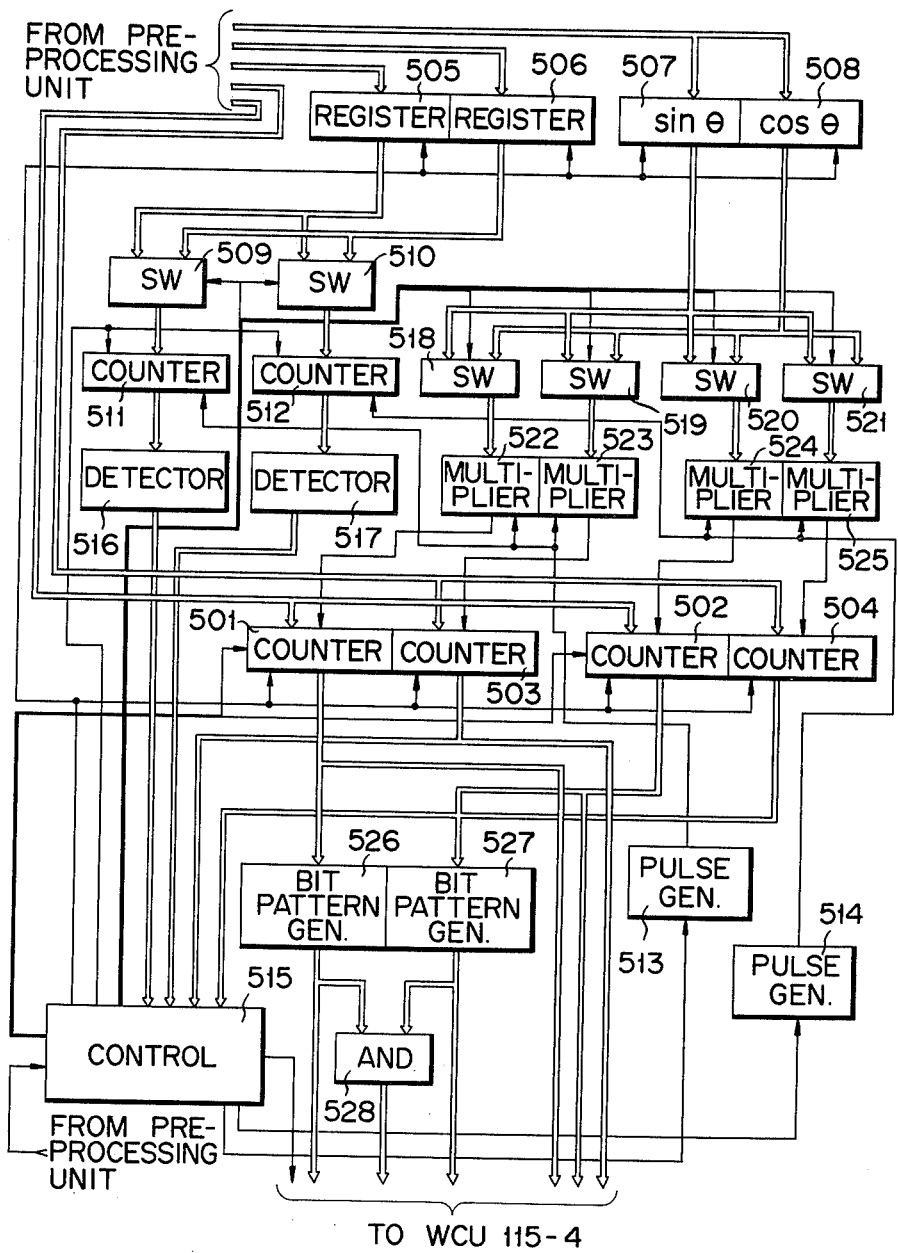
FIG. 16 is a block diagram of a function generating circuit which is used to process the rectangular pattern shown in FIG. 15 in a different manner.

In the above-described embodiment, a pattern to be drawn on the test piece 106 is divided into basic patterns whose bases are parallel to X-axis. If the pattern is such a rectangular pattern as illustrated in FIG. 15, pattern data may be more easily processed by such a function generating circuit as shown in FIG. 16.

Let $\theta$ denote the angle defined by X-axis and the base O A of the rectangle OABC, L the length of the side OA or BC, H the length of the side OC or AB, and PQ a line which is parallel to X-axis and which moves in Y-axis direction. As long as point P is on the side OA, its X-axis position PXA its Y-axis position PYA are expressed as follows:

$PXA = OP \cos \theta$ $PYA = OP \sin \theta$.

As long as point P is on the side AB, its X-axis position PXB and its Y-axis position PYB are represented as follows:

$PXB = -AP \sin \theta + L \cos \theta$ $PYB = AP \cos \theta + L \sin \theta$.

As long as point Q is on the side OC, its X-axis position QXC and its Y-axis position QYC are expressed as follows:

$QXC = OQ \sin \theta$ $QYC = OQ \cos \theta$.

As long as point Q is on the side CB, its X-axis position QXB and its Y-axis position QYB are expressed as follows:

$QXB = CQ \cos \theta - H \sin \theta$ $QYB = CQ \sin \theta + H \cos \theta$.

In this case, parameter data POX, POY, L, H and $\theta$ are stored in RAM 110 shown in FIG. 5. The data POX and POY show the X-axis coordinate value and Y-axis coordinate value of point O. Pattern data are read out from RAM 110 and then processed by such a pre-processing unit as shown in FIG. 6. Registers 214, 215, 216, 217 and 218 of the pre-processing unit stores the parameter data POX, POY, H, L and $\theta$, respectively. This embodiment need not be provided with such a register 219 as shown in FIG. 6.

The function generating circuit shown in FIG. 16 processes pattern data POX, POY, H, L and $\theta$ from the pre-processing unit which is a little different from the dot pattern data to such a write control unit 115-4 as shown in FIG. 11. The function generating circuit includes presettable counters 501 and 502 for receiving the pattern data POX, presettable counters 503 and 504 for receiving the pattern data POY, a register 505 for receiving the pattern data H, a register 506 for receiving the pattern data H and trigonometric function generators 507 and 508 for receiving the pattern data $\theta$. The output data of the registers 505 and 506 are supplied to presettable down-counters 511 and 512 through switches 509 and 510. The down-counters 511 and 512 count pulses from a pulse generator 513 and pulses from a pulse generator 514, respectively. These pulse generators 513 and 514 are controlled by a control unit 515. The output data of the down-counter 511 is supplied to a zero count detector 516, and the output data of the down-counter 512 to another zero count detector 517. When the zero count detector 516 detects that the count of the down-counter 511 is zero, it supplies an output signal to the control unit 515. Similarly, when the zero count detector 517 detects that the count of the down-counter 512 is zero, it supplies an output signal to the control unit 515.

Upon receipt of the pattern data $\theta$ from the pre-processing unit, the trigonometric function generators 507 and 508 produce a data representing $\sin \theta$ and a data representing $\cos \theta$, respectively. They supply these output data selectively to rate multipliers 522 to 525 via switches 518 to 521. The rate multipliers 522 and 523 divide the frequency of the pulses from the pulse generator 513 with a ratio which is determined by the output data of the function generator 507. On the other hand, the rate multipliers 524 and 525 divide the frequency of the pulses from the pulse generator 514 with a ratio which is determined by the output data of the function generator 508. The output pulses of the rate multipliers 522, 523, 524 and 525 are supplied to the presettable counters 501, 502, 503 and 504, respectively. The output counts of the counters 501 and 502 are supplied to bit pattern generators 526 and 527 are of the same construction as the bit pattern generators 310 and 311 shown in FIG. 9. The output data of the bit pattern generators 526 and 527 are supplied to an AND circuit 528. The output data of the generators 526 and 527 are also supplied to the write control unit 115-4 together with the output data of the AND circuit 528.

Now there will be described how the function generating circuit of FIG. 16 operates.

Upon receipt of an control signal from the control unit 200 of the pre-processing unit, the control unit 515 feeds an enable signal to the presettable counters 501 to 504, resisters 505 and 506 and trigonometric function generators 507 and 508. As a result, the pattern data POX is set in the presettable counters 501 and 502, and the pattern data POY in the presettable counters 503 and 504. At the same time, the pattern data L and H are stored into the registers 505 and 506, respectively, and the function generators 507 and 508 receive the data representing sin $\theta$ and the data representing cos $\theta$. Thereafter, the control unit 515 supplies a position control signal to the switches 509, 510 and 518 to 521. The presettable down-counters 511 and 512 are then set to a count which corresponds to the pattern data L from the register 505 and a counter which corresponds to the pattern data H from the register 506, respectively. Further, the output data (cos $\theta$) of the function generator 508 is supplied to control terminals of the rate multipliers 522 and 525, and the output data (sin $\theta$) of the function generator 507 to control terminals of the rate multipliers 523 and 524. At the same time, the control unit 515 supplies a control signal to the counters 501 to 504, setting the counter 502 in down-counting mode and the counters 501, 503 and 504 in up-counting mode.

Then, the control unit 515 supplies an enable signal to the pulse generator 513, thus causing the pulse generator 513 to produce pulses. The rate multipliers 522 and 523 divide the frequency of the output pulses of the pulse generator 513 to provide a pulse representing fN cos $\theta$ and a pulse representing fN sin $\theta$, respectively, where fN denotes the pulse repetition rate of the pulse generator 513. The pulse fN cos $\theta$ supplied to the presettable counter 501, and the pulse fN sin $\theta$ to the presettable counter 503. Suppose that N pulses are supplied from the pulse generator 513 to the presettable counter 503 and that the counter 503 counts up one count to change its count POY to POY+N sin $\theta$(=POY+1). Then, upon detecting that the counter 503 has counted up one count, the control unit 515 stops supplying an enable signal to the pulse generator 513 and starts supplying an enable signal to the pulse generator 514. As a result, the output pulse fM cos $\theta$ of the rate multiplier 524 is supplied to the presettable counter 502, and the output pulse fM sin $\theta$ of the rate multiplier 525 to the presettable counter 504. Where, fM denotes the pulse repetition rate of the pulse generator 514. Suppose that M pulses are supplied from the pulse generator 514 to the presettable counter 504 and that the counter 504 counts up one count to change its count. Then, upon detecting this, the control unit 515 disables the pulse generator 514. At this moment, the counts of the counters 501 and 502 are (POX+N cos $\theta$) and (POX−M sin $\theta$), respectively. The count data (POX+N cos $\theta$) is supplied to a bit pattern generator 526 as a bit position signal, and the count data (POX−M sin $\theta$) to a bit pattern generator 527 as a bit position signal. These bit pattern generators 526 and 527 generate a bit pattern data formed of 16 bits. The first five bits of the count data of the counter 501 are supplied to the write control unit 115-4 as a word position signal. Similarly, the first five bits of the count data of the counter 502 are supplied also to the write control unit 115-4 as a word position signal. At the same time, the control unit 515 supplies a control signal to the write control unit 115-4.

The pulse generators 513 and 514 are alternately and repeatedly operated in response to an enable signal from the control unit 515 thereby to process pattern data in the same manner as described in the preceding paragraph.

When the counter 511 becomes zero at last, or when point P reaches point A so that the count data of the presettable counter 503 becomes (POY+L sin $\theta$), the control unit 515 generates a control signal to alter the switching positions of the switches 509, 518 and 519. The control unit 515 then supplies a preset signal to the presettable counter 511 and a control signal to the presettable counter 501. The counter 501 is therefore put into down-counting mode. Thereafter, the control unit 515 enables the pulse generators 513 and 514 alternately in the above-mentioned manner.

When the counter 512 becomes zero, or when point Q reaches point C so that the count data of the counter 504 becomes (POY+H cos $\theta$), the control unit 515 generates a control signal thereby to alter the switching positions of the switches 510, 520 and 521. The control unit 515 then supplies a preset signal to the presettable counter 512 and a control signal to the presettable counter 502. The counter 502 is therefore put into up-counting mode. Thereafter, the control unit 515 enables the pulse generators 513 and 514 alternately to process pattern data in the above-mentioned manner. During this data processing, point P exists on the side AB of the rectangle shown in FIG. 15, and point Q on the side CB of the rectangle.

When both counters 511 and 512 become zero, or when points P and Q reach point B so that the count data of the counters 503 and 504 become (POY+L sin $\theta$+H cos $\theta$), the pattern data processing is completed with respect to the rectangular pattern shown in FIG. 15.

This inventon is not limited to the above-described embodiments. In the embodiments described above one word is constituted by 16 bits. Instead, a word may be constituted by 8 bits or more bits. Further, the function generating circuit FIG. 16 processes pattern data showing a rectangular pattern. It may process pattern data showing a triangle or a parallelogram the inner angles of which are known.

What we claim is:

1. An exposure apparatus using an electron beam comprising:

first memory means for storing pattern parameters which are used to represent various basic patterns;

data processing means for reading out from said first memory means the pattern parameters which represent the basic patterns necessary for forming a pattern to be drawn;

dot pattern data generating means for receiving the pattern parameters read out through said data processing means to generate dot pattern data which correspond to the received pattern parameters, and including a bit pattern generating circuit for generating bit pattern data which correspond to a plurality of parallel lines passing a basic pattern, each bit pattern data containing line segment data representing that line segment of the corresponding parallel line which meets the sides of the basic pattern, a plurality of second memory means, a write control circuit for sequentially writing into said plurality of second memory means the bit pattern data delivered from said bit pattern generating circuit, whereby each of said plurality of second memory means stores the pattern data required for forming a pattern in a different unit pattern area, and a read control circuit for reading the bit pattern data one after another from said plurality of second memory means; and electron beam generating means for generating an electron beam according to the bit pattern data sequentially delivered from said plurality of second memory means to achieve a raster scanning on a predetermined region, using the electron beam.

2. The exposure apparatus according to claim 1, wherein said parallel lines are set to extend parallel to an upside of a quadrilateral basic pattern whose upside and base are parallel to each other, and said bit pattern generating circuit includes a preprocessing unit for providing, based on the pattern parameters read out from said first memory means, parameter data which represent the positions of the corners of the trapezoidal basic pattern and a function generating unit for providing, based on the parameter data delivered from the pre-processing unit, bit pattern data each containing line segment data representing those line segments of the corresponding parallel line which meets the sides of the trapezoidal basic pattern.

3. The exposure apparatus according to claim 2, wherein said pre-processing unit processes the pattern parameters read out from said first memory means to generate first and second data which represent the positions of ends of one of the upper and base of the quadrilateral basic pattern, a third data which represents the vertical position of said one of the upper and base of the trapezoidal basic pattern, a fourth data which represents the horizontal distance between one end of said one of the upper and base of the quadrilateral basic pattern and the corresponding end of the other of the upper and base of the quadrilateral basic pattern, a fifth data which represents the horizontal distance between the other end of said one of the upper and base of the quadrilateral basic pattern and the corresponding other end of the other of the upper and base of the quadrilateral basic pattern, and a sixth data which represents the vertical distance between the upper and base of the quadrilateral basic pattern, and said function generating unit includes first, second and third registers for storing the fourth, fifth and sixth data from said pre-processing unit, respectively, first, second and third pulse generators for generating pulses at pulse repetition rates corresponding to the contents of the first, second and third registers, respectively, first, second and third presettable counters to be preset with the first, second and third data from said pre-processing unit, respectively for counting the pulses from said first, second and third pulse generators, respectively, a control unit coupled to said third presettable counter for generating a control signal every time said third presettable counter counts a predetermined number of pulses, and first and second bit pattern generators for receiving, in response to a control signal from said control unit, the count data of the first and second presettable counters, respectively for generating words constituted by a predetermined number of bits and corresponding to the count data of the first and second presettable counters, respectively.

4. The exposure apparatus according to claim 1, wherein said basic pattern is a parallelogram having predetermined inner angles, and said bit pattern generating circuit includes a pre-processing unit for providing, based on the pattern parameters read out from said first memory means, first and second data representing the horizontal and vertical positions of one corner of the basic pattern, a third data representing the angle defined by a first side of the basic pattern and said parallel lines, a fourth data representing the length of said first side of the basic pattern and a fifth data representing the distance between said first side of the basic pattern and a second side opposite to the first side and a function generating unit for processing the first to fifth data from the pre-processing unit to provide a bit pattern data containing line segment data which represent the line segment of each parallel line which meet the sides of the basic pattern.

5. The exposure apparatus according to claim 4, wherein said function generating unit includes first and second presettable counters to be preset with the first data from said pre-processing unit, third and fourth presettable counters to be preset with the second data from said pre-processing unit, a function generator for generating, upon receipt of the third data from said pre-processing unit, first and second trigonometric function data which corresponds to the third data, first and second pulse generators, first and second frequency dividers coupled to the function generator and the first pulse generator for dividing the frequency of the pulses from the first pulse generator according to the trigonometric function data from the function generator, respectively and supplying the frequency-divided pulses to the first and third presettable counters, thus causing the first and third presettable counters to count the pulses till their counts come to represent the horizontal and vertical distances between said corner of the basic pattern and a point on said first side of the basic pattern, third and fourth frequency dividers coupled to the function generator and the second pulse generator for dividing the frequency of the pulses from the second pulse generator according to the trigonometric function data from the function generator, respectively and supplying the frequency-divided pulses to the second and fourth presettable counters, thus causing the second and fourth presettable counters to count the pulses till their counts come to represent the horizontal and vertical distances between said corner of the basic pattern and a point on a third side of the basic pattern which ends at said corner, a first bit pattern generator for generating a word data constituted by a predetermined number of bits corresponding to the count data of the first presettable counter every time the third presettable counter counts a predetermined number of pulses, and a second bit pattern generator for generating a word data constituted by a predetermined number of bits corresponding to the count data of the second presettable counter every time the fourth presettable counter counts a predetermined number of pulses.

6. The exposure apparatus according to claim 5, wherein said function generating unit further includes first and second registers for storing the third and fourth data from said pre-processing unit, respectively, fifth and sixth presettable counters to be preset with the data stored in the first and second registers, respectively, and to count down the pulses from the first and second pulse generators, a first control circuit for supplying, upon detecting that the fifth presettable counter is zero, the data stored in the second register to the fifth presettable counter and the first and second trigonometric function data from the function generator to the first and second frequency dividers, thus causing the first and third presettable counters to count the pulses from the first pulse generator till their counts come to represent the horizontal and vertical distances between said corner of the basic pattern and a point on the second side of the basic pattern which is opposite to the first side ending at said corner, and a second control circuit for supplying, upon detecting that the sixth presettable counter is zero, the data stored in the first register to the sixth presettable counter and the first and second trigonometric function data from the function generator to the third and fourth frequency dividers, thus causing the second and fourth presettable counters to count the pulses from the second pulse generator till their counts come to represent the horizontal and vertical distances between said corner of the basic pattern and a point on the second side of the basic pattern which is opposite to said first side.

7. The exposure apparatus according to claim 1, wherein said pattern to be drawn is divided into a plurality of unit pattern areas, and said data processing means reads out from said first memory means the pattern parameters which correspond to each unit pattern area.

8. An exposure apparatus using an electron beam comprising;
  first memory means for storing pattern parameters which are used to represent various basic patterns;
  data processing means for reading out from said first memory means the pattern parameters which represent the basic patterns necessary for forming a pattern to be drawn;
  dot pattern data generating means for receiving the pattern parameters read out through said data processing means to generate dot pattern data which correspond to the received pattern parameters, and including a bit pattern generating circuit for generating bit pattern data which correspond to a plurality of parallel lines passing a basic pattern, each bit pattern data containing line segment data representing that line segment of the corresponding one of said parallel lines which meets the sides of the basic pattern, second memory means, a write control circuit for writing into said second memory means the bit pattern data delivered from said bit pattern generating circuit, one after another, and a read control circuit for reading the bit pattern data one after another from said memory means; and
  electron beam generating means for generating an electron beam according to the bit pattern data delivered from said second memory means to achieve a raster scanning on a predetermined region, using the electron beam;
  wherein said parallel lines are set to extend parallel to an upside of a quadrilateral basic pattern whose upside and base are parallel to each other, and said bit pattern generating circuit includes a preprocessing unit for providing, based on the pattern parameters read out from said first memory means, parameter data which represents the positions of the corners of the quadrilateral basic pattern and a function generating unit for providing, based on the parameter data delivered from the preprocessing unit, bit pattern data each containing line segment data representing that line segment of the corresponding one of said parallel lines which meets the sides of the quadrilateral basic pattern, and;
  said pre-processing unit processes the pattern parameters read out from said first memory means to generate first and second data which represent the positions of ends of one of the upper and base of the quadrilateral basic pattern, a third data which represents the vertical position of said one of the upper and base of the quadrilateral basic pattern, a fourth data which represents the horizontal distance between one end of said one of the upper and base of the quadrilateral basic pattern and the corresponding end of the other of the upper and base of the quadrilateral basic pattern, a fifth data which represents the horizontal distance between the other end of said one of the upper and base of the quadrilateral basic pattern and the corresponding other end of the other of the upper and base of the quadrilateral basic pattern, and a sixth data which represents the vertical distance between the upper and base of the quadrilateral basic pattern, and said function generating unit includes first, second and third registers for storing the fourth, fifth and sixth data from said pre-processing unit, respectively, first, second and third pulse generators for generating pulses at pulse repetition rates corresponding to the contents of the first, second and third presettable counters to be preset with the first, second and third data from said pre-processing unit, respectively for counting the pulses from said first, second and third pulse generators, respectively, a control unit coupled to said third presettable counter for generating a control signal every time said third presettable counter counts a predetermined number of pulses, and first and second bit pattern generators for receiving, in response to a control signal from said control unit, the count data of the first and second presettable counters, respectively for generating words constituted by a predetermined number of bits and corresponding to the count data of the first and second presettable counters, respectively.

9. An exposure apparatus using an electron beam comprising:
  first memory means for storing pattern parameters which are used to represent various basic patterns;
  data processing means for reading out from said first memory means the pattern parameters which repesent the basic patterns necessary for forming a pattern to be drawn;
  dot pattern data generating means for receiving the pattern parameters read out through said data processing means to generate dot pattern data which correspond to the received pattern parameters, and including a bit pattern generating circuit for generating bit pattern data which correspond to a plurality of parallel lines passing a basic pattern, each bit pattern data containing line segment data representing that line segment of the corresponding one of said parallel lines which meets the sides of the basic pattern, second memory means, a write control circuit for writing into said second memory means the bit pattern data delivered from said bit pattern generating circuit, one after another, and a read control circuit for reading the bit pattern data one after another from said second memory means; and
  electron beam gathering means for generating an electron beam according to the bit pattern data delivered from said second memory means to achieve a raster scanning on a predetermined region, using the electron beam;
  wherein said basic pattern is a parallelogram having predetermined inner angles, and said bit pattern generating circuit includes a pre-processing unit for providing, based on the pattern parameters read out from said first memory means, first and second data representing the horizontal and vertical positions of one corner of the basic pattern, a third data representing the angle defined by a first side of the basic pattern and said parallel lines, a fourth data representing the length of said first side of the basic pattern and a fifth data representing the distance between said first side of the basic pattern and a second side opposite of the first side and a function generating unit for processing the first to fifth data from the preprocessing unit to provide a bit pattern containing line segment data which represent the line segment of each parallel line which meets the sides of the basic pattern, and said function generating unit includes first and second presettable counters to be preset with the first data from said preprocessing unit, third and fourth presettable counters to be preset with the second data from said pre-processing unit, a function generator for generating, upon receipt of the third data from said pre-processing unit, first and second trigonometric function data which corresponds to the third data, first and second pulse generators, first and second frequency dividers coupled to the function generator and the first pulse generator for dividing the frequency of the pulses from the first pulse generator according to the trigonometric function data from the function generator, respectively and supplying the frequency-divided pulse to the first and third presettable counters, thus causing the first and third presettable counters, to count the pulses till their counts come to represent the horizontal and vertical distances between said corner of the basic pattern and a point on said first side of the basic pattern, third and fourth frequency dividers coupled to the function generator and the second pulse generator for dividing the frequency of the pulses from the second pulse generator according to the trigonometric function data from the function generator, respectively and supplying the frequency-divided pulses to the second and fourth presettable counters, thus causing the second and fourth presettable counters to count the pulses till their counts come to represent the horizontal and vertical distances between said corner of the basic pattern and a point on a third side of the basic pattern which ends at said corner, a first bit pattern generator for generating a word data constituted by a predetermined number of bits corresponding to the count data of the first presettable counter every time the third presettable counter counts a predetermined number of pulses, and a second bit pattern generator for generating a word data constituted by a predetermined number of bits corresponding to the count data of the second presettable counter every time the fourth presettable counter counts a predetermined number of pulses.

10. The exposure apparatus according to claim 9, wherein said function generating unit further includes first and second registers for storing the third and fourth data from said pre-processing unit, respectively, fifth and sixth presettable counters to be preset with the data stored in the first and second registers, respectively, and to count down the pulses from the first and second pulse generators, a first control circuit for supplying, upon detecting that the fifth presettable counter is zero, the data stored in the second register to the fifth presettable counter and the first and second trigonometric function data from the function generator to the first and second frequency dividers, thus causing the first and second presettable counters to count the pulses from the first pulse generator till their counts comes to represent the horizontal and vertical distances between said corner of the basic pattern and a point on the second side of the basic pattern which is opposite to the first side ending at said corner, and a second control circuit for supplying, upon detecting that the sixth presettable counter is zero, the data stored in the first register to the sixth presettable counter and the first and second trigonometric function data from the function generator to the third and fourth frequency dividers, thus causing the second and fourth presettable counters to count the pulses from the second pulse generator till their counts come to represent the horizontal and vertical distances between said corner of the basic pattern and a point on the second side of the basic pattern which is opposite to said first side.

* * * * *